United States Patent

Ferretti et al.

[11] Patent Number: 5,533,465
[45] Date of Patent: Jul. 9, 1996

[54] HYDROTHERMAL CRYSTALLIZATION VESSELS

[75] Inventors: August Ferretti; Oral R. Van Buskirk, both of Wilmington, Del.

[73] Assignee: E. I. Du Pont de Nemours and Company, Wilmington, Del.

[21] Appl. No.: 376,595

[22] Filed: Jan. 20, 1995

[51] Int. Cl.$^6$ .................................................. C30B 7/10
[52] U.S. Cl. ................. 117/224; 117/71; 117/72
[58] Field of Search ................... 117/71, 72, 224

[56] References Cited

U.S. PATENT DOCUMENTS

| | | | |
|---|---|---|---|
| 2,990,258 | 6/1961 | Augustine | 117/224 |
| 3,051,558 | 8/1962 | Jost | 23/273 |
| 3,245,760 | 4/1966 | Sawyer | 23/273 |
| 3,747,798 | 7/1973 | Marchal | 220/55 Y |
| 3,949,323 | 4/1976 | Bierlein et al. | 332/7.51 |
| 3,960,501 | 6/1976 | Butuzen et al. | 117/224 |
| 5,037,281 | 8/1991 | Lane et al. | 418/55.4 |
| 5,057,286 | 10/1991 | Chiba et al. | 117/224 |
| 5,322,591 | 6/1994 | Harris et al. | 117/71 |

FOREIGN PATENT DOCUMENTS 1329275  9/1970  United Kingdom .................... 117/224

OTHER PUBLICATIONS

Laudise, R. A. et al, "Pressure balance under hydrothermal conditions", *J. of Crystal Growth*, 140, 51–56, (1994).
Laudise, R. A. et al., "Hydrothermal Crystal Growth", *J. Solid State Physics*, 12, 149–222 (1961).
"The EnerRing Seal Line", Advanced Products Company Brochure, Advanced Products Company, North Haven, CT 06473.
Ballman, A. A. et al, "Hydrothermal Growth", *The Art and Science of Growing Crystals*, J. J. Gilman, Ed., Wiley & Sons, New York.

*Primary Examiner*—Robert Kunemund

[57] ABSTRACT

A seal apparatus is disclosed for sealing an outlet of a pressurized chamber from fluid loss from the chamber and contamination to the chamber. The apparatus includes certain combinations of (a) a chamber outlet structure; (b) a removable cover; (c) means for reversibly connecting the cover to the chamber outlet structure; and (d) a compressible self-energizing ring having a surface which consists essentially of a material selected from the group consisting of noble metals, noble metal alloys and polytetrafluoroethylene, which has a hardness selected to substantially avoid deformation when the cover is sealed to the chamber outlet structure.

Also disclosed are certain pressure vessels for hydrothermal crystal growth using a crystal growth media, which comprise (a) a vessel base and (b) a removable vessel cover. The vessels include (i) certain said combinations employing a compressible self-energizing ring with a surface resistant to corrosion by the crystal growth media and a hardness lower than the hardness of the seal surfaces of the base and cover; and/or (ii) (in an aspect of this invention especially suited for the growth of crystals of the formula $MTiOXO_4$ wherein M is selected from the group consisting of K, Rb, Tl, $NH_4$ and mixtures thereof and X is selected from the group consisting of P, As and mixtures thereof) vessel bodies of a nickel alloy essentially free of titanium.

10 Claims, 2 Drawing Sheets

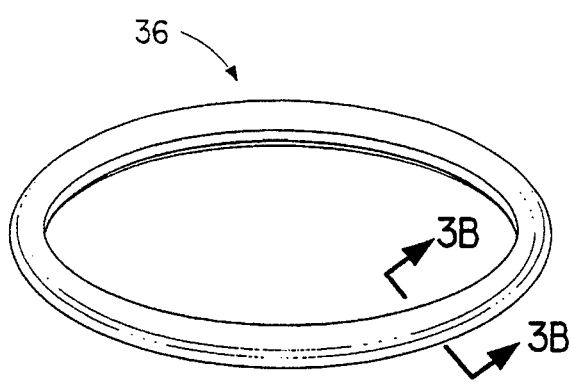
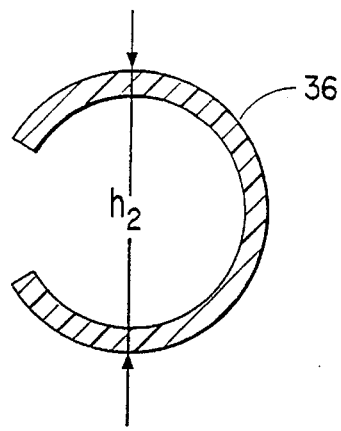
FIG.3A  FIG.3B
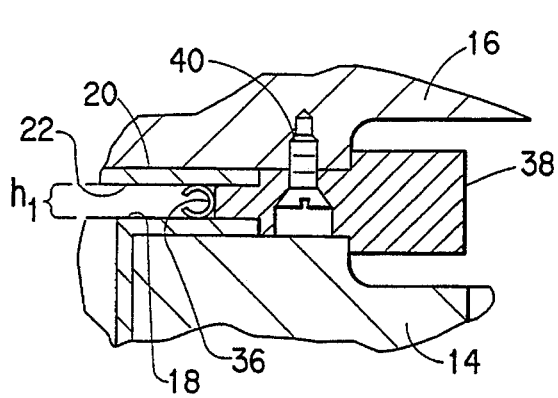
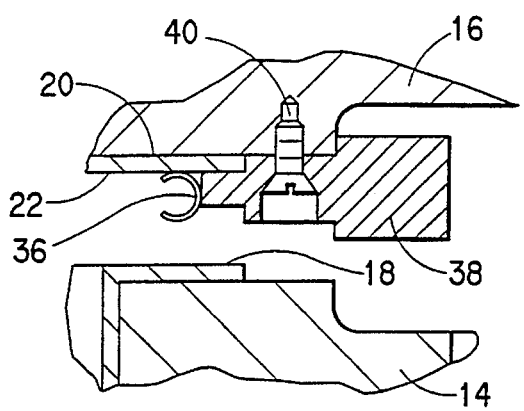
FIG.4A  FIG.4B
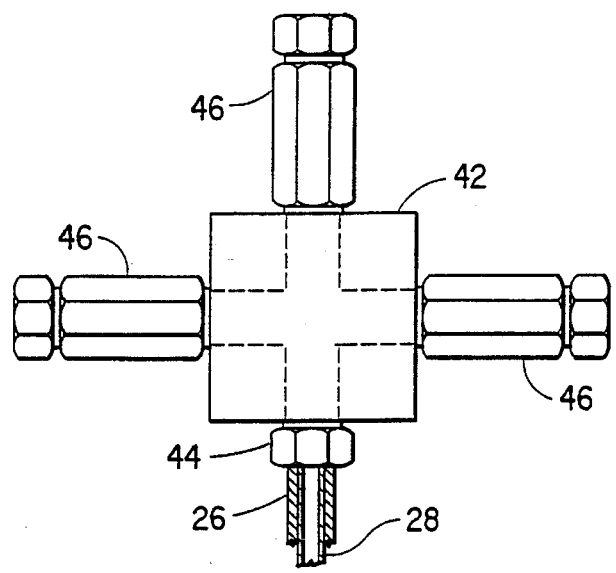
FIG.5

HYDROTHERMAL CRYSTALLIZATION VESSELS

FIELD OF THE INVENTION

This invention relates to vessels used in hydrothermal crystal growth processes involving elevated temperatures and pressures and more particularly to vessels used for processes such as $KTiOPO_4$ crystal manufacture which employ corrosive media.

BACKGROUND OF THE INVENTION

The need for optical-quality single crystals of materials exhibiting non-linear optical properties is well known. Potassium titanyl phosphate (i.e., KTP) is particularly useful in nonlinear optical devices (see, e.g., U.S. Pat. No. 3,949,323). U.S. Pat. No. 3,949,323 discloses the preparation of crystals of compounds such as potassium titanyl phosphate by hydrothermal methods. Hydrothermal crystal growth processes have typically been high pressure processes involving crystal formation from a growth medium comprising mineralizer solution. A nutrient source such as a polycrystalline composition of the same material is provided, and seed crystals are often used to provide nucleation sites. Hydrothermal methods of crystal growth are considered particularly advantageous relative to flux methods of crystal growth for certain applications since they produce crystals having lower susceptibility to laser damage.

Hydrothermal methods typically require expensive reaction vessels to withstand the temperatures and/or pressures associated with crystal growth conditions and can involve long crystal growth periods to achieve crystals of the desired size and optical quality. Additionally, almost all hydrothermal crystals require growth in noble metal containers due to the corrosive nature of the growth solution, which also adds to the expense of the vessel. (Quartz is an exception, since it is commonly grown under hydrothermal conditions directly in steel autoclaves where corrosive attack of the autoclave is minimal because the common mineralizers react with iron to form sodium iron silicates which adhere to the autoclave wall and inhibit further corrosion.) See, Laudise et al., *Journal of Crystal Growth* 140 (1994) 51–56.

While substantial progress has been made in reducing the temperatures associated with hydrothermal crystal growth processes (see, e.g., U.S. Pat. No. 5,066,356), the relatively high reaction pressures typically associated with the hydrothermal process can still limit the practical application of the process. As is recognized in the art, vessels with noble metal liners have generally been limited to diameters of about 1 inch (2.54 cm) or less, and for larger diameters a sealed (often welded) noble metal can has been used to contain the corrosive growth solution. This generally requires balancing the pressure between the can and the autoclave with non-reactive fluid (e.g., water) at a fill to approximately equal the pressure at the operating conditions. (See Laudise et al., *Journal of Crystal Growth* 140 (1994) 51–56). With some fluid systems it is not possible to balance the two pressures during the entire heating and cooling cycle, and in those cases the gold can becomes deformed during the process. Deformation can result in container leaks, or problems in removing the container from the autoclave. When the precious metal configuration is used for crystal growth, the non-reproducible deformation results in non-uniform fluid circulation patterns and can effect the quality of the resulting crystals.

In addition to the effect that the deformation of welded cans may have on the reproducibility of the fluid circulation patterns during crystal growth, the deformation makes it difficult to insert thermocouples into the reaction chamber to measure the growth conditions accurately. Because of this difficulty, the general procedure used for the welded can technique is to use thermocouple wells in the heavy wall of the outer pressure containment vessel. As a consequence of the variations in location of the thermocouples and differences in external insulations, the actual growth temperatures and the temperatures differentials between sections of the reaction zones are not accurate and can lead to reproducibility problems.

In any case, hydrothermal crystal growth using corrosive fluids at high temperatures and pressures (typically about 500° C. and 10,000 psi (68.9 kPa)), often use a noble metal container inside a base metal high pressure autoclave. In small diameter systems (e.g., 1 inch (2.54 cm) diameter or less) it has been possible to use a precious metal liner combined with precious metal gaskets and a clad head section. This sealing configuration is bolted down to the vessel using a variety of bolting arrangements. However, when it becomes desirable to scale up and increase the inner diameter of the vessel, the bolting forces used must be increased by a significant factor to balance the increased internal force on the head surface. The larger bolting forces combined with moderate temperatures over time can result in partial welding of the precious metal seal surfaces. As a result, the seal surfaces are damaged when the vessel head is removed from the vessel at the conclusion of the run. Platinum and its alloys are especially susceptible to pressure welding (see R. A. Laudise and J. W. Nielsen, *J. Solid State Physics*, 12 (1961) 161).

Thus, there is a need for vessels that avoid the problems associated with the sealed can reactor system, and the vessel size limitations of the conventional noble metal lined reactors. The need exists to increase the capacity of hydrothermal crystal growth vessels, and at the same time provide safe, reliable and economical seals for such larger systems.

SUMMARY OF THE INVENTION

This invention provides a seal apparatus for sealing an outlet of a pressurized chamber. The apparatus comprises (a) a chamber outlet structure having a chamber seal surface consisting essentially of a noble metal alloy around the periphery of the chamber outlet and extending radially therefrom; (b) a removable cover for sealing the chamber outlet structure, having a cover area for covering the chamber outlet, said cover area having a cover seal surface consisting essentially of a noble metal alloy which opposes the chamber seal surface when the cover is sealed to the chamber outlet structure; (c) means for reversibly connecting the cover to the chamber outlet structure with the cover seal surface positioned a selected distance from the chamber seal surface when the cover is sealed to the chamber outlet structure; and (d) a compressible self-energizing ring having a ring height greater than said selected distance prior to sealing the cover to the chamber outlet structure, and a perimeter shaped for positioning around the chamber outlet and between the chamber seal surface and the cover seal surface, such that when the cover is sealed to the chamber outlet structure, the ring is compressed between the cover seal surface and the chamber seal surface to a height equal to the selected distance, thereby providing a seal against fluid loss from the chamber and contamination to the chamber. The surface of the ring consists essentially of a material selected from the group consisting of noble metals, noble metal alloys and polytetrafluoroethylene, which has a hardness lower than the hardness of the chamber seal surface and lower than the hardness of the cover seal surface, such that neither the chamber seal surface nor the cover seal surface is substantially deformed when the cover is sealed to the chamber outlet structure.

This invention further provides certain pressure vessels for hydrothermal crystal growth using a crystal growth media, which comprise (a) a vessel base including (i) a vessel body having a cavity with a cavity wall and a cavity outlet, and (ii) a cavity liner which is resistant to corrosion by the crystal growth media, having an outer wall in contact with and supported by the cavity wall, an inner wall defining a crystal growth chamber having a chamber outlet, and a flange positioned at the perimeter of the chamber outlet, said flange having a chamber seal surface around the perimeter of the chamber outlet and extending radially therefrom; and (b) a removable vessel cover.

In one aspect of this invention, pressure vessels are provided wherein the vessel cover includes a cover plate for sealing to the flange, said cover plate being resistant to corrosion by the crystal growth media and having a cover area for covering the chamber outlet, said cover area having a cover seal surface which opposes the chamber seal surface when the cover plate is sealed to the flange; and the pressure vessel further comprises (c) means for reversibly connecting the vessel cover to the vessel body such that the cover seal surface is positioned a selected distance from the chamber seal surface when the cover plate is sealed to the flange; and (d) a compressible self-energizing ring having an uncompressed height greater than the selected distance prior to sealing the cover plate to the flange. The ring is shaped for positioning around the perimeter of the chamber outlet and between the chamber seal surface and the cover seal surface, such that when the cover plate is sealed to the flange, the ring is compressed between the cover seal surface and the chamber seal surface to a height equal to the selected distance, thereby providing a seal against fluid loss from the chamber and contamination to the chamber. The surface of the ring is resistant to corrosion by the crystal growth media, and has a hardness lower than the hardness of the chamber seal surface and lower than the hardness of the cover seal surface, such that neither the chamber seal surface nor the cover seal surface is substantially deformed when the cover is sealed to the chamber outlet structure.

In an aspect of this invention especially suited for the growth of crystals of the formula $MTiOXO_4$ wherein M is selected from the group consisting of K, Rb, Tl, $NH_4$ and mixtures thereof and X is selected from the group consisting of P, As and mixtures thereof, pressure vessels are provided where the vessel body is of a nickel alloy essentially free of titanium; the vessel cover has a cover seal surface which opposes the chamber seal surface when the vessel cover is sealed to the vessel base; and the pressure vessel further comprises (c) means for reversibly connecting the vessel cover to the vessel body, and (d) means for sealing the crystal growth chamber between the cover seal surface and the chamber seal surface against fluid loss from the chamber and contamination to the chamber.

BRIEF DESCRIPTION OF THE DRAWINGS

FIG. 3A shows a perspective view of a C-ring.

FIG. 3B shows a cross-sectional view of the C-ring of FIG. 3A.

FIG. 4A is an exploded cross-sectional view of the sealing configuration identified in FIG. 2.

FIG. 4B is a view of the sealing configuration of FIG. 4A prior to sealing.

FIG. 5 shows a T-block which may be used for introducing instruments into the vessel.

DETAILED DESCRIPTION OF THE INVENTION

Figure 1:
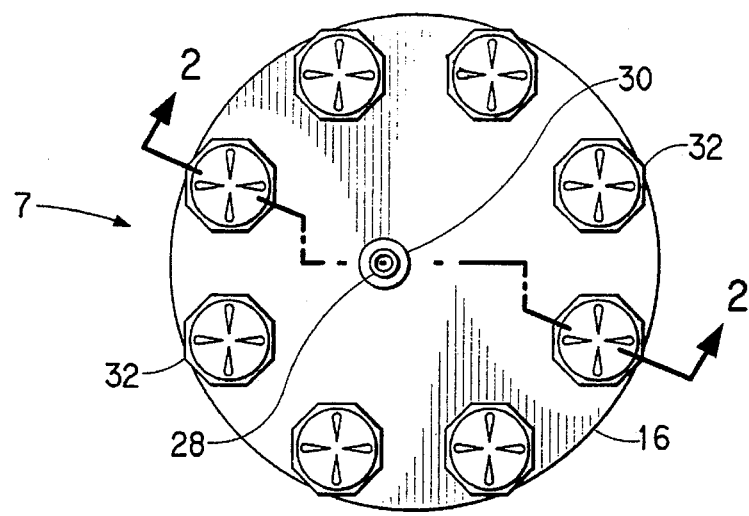
FIG. 1 shows a top view of a vessel for hydrothermal crystal growth.

The pressure sealing configuration of this invention can be operated at elevated temperatures and pressures, is preferably corrosion resistant, is generally reusable without the need for additional machining or welding after each use, and allows for larger vessels (e.g., cylindrical vessels having diameters greater than about 1.25 inches (3.25 cm)). This sealing configuration may be employed in a vessel for hydrothermal crystal growth as described herein and includes a self-energizing ring (e.g., a C-ring); opposing seal surfaces (preferably having a composition selected to resist corrosion and having sufficient mechanical properties such that there is no substantial surface damage or distortion from the C-ring when under operating conditions); and optionally, a support plate for the C-ring, which provides support against internal radial forces and controls the degree of C-ring compression. The flange composition should not be prone to pressure welding with the C-ring when subjected to heat and pressure for long time periods.

For hydrothermal crystal growth in corrosive fluids, it is necessary that the vessel cavity liner be corrosion resistant. By corrosion resistant is meant that the material is essentially unreactive with the corrosive crystal growth media used in the hydrothermal crystallization (i.e., none of the elements in the material are soluble in the corrosive crystal growth media and the corrosive crystal growth media will not attack the material and weaken its structural integrity).

Of note are cylindrical vessels having inner diameters greater than about 1.25 inches (3.25 cm) which can be provided by the invention described herein. Preferably, the shape of the vessel body is chosen to reduce the ratio of sealing force to crystal growth volume. The vessel shape may also take into account the expected direction of crystal growth on the seed crystals, such that unused crystal growth volume is minimized. Considering these factors, the vessel body may be shaped to provide an oblong or annular shaped internal cavity. The vessel may be constructed from any metal or alloy having sufficient strength at operating temperatures, typically about 300° C. to about 500° C. for crystal production.

The lined vessels of this invention permit the addition of gases or liquids to the reaction chamber after the vessel is sealed. They may also allow the use of reaction stirrers to enhance the crystalline uniformity, or a means for rotating the seed configuration. (The standard commercial operations employing sealed gold cans cannot easily be configured to have thermocouples in the reaction chamber because of the can deformation and therefore use thermocouples in the wall of the autoclave or strapped to the outside wall of the autoclave.) The vessel design of this invention permits the incorporation of multi-point thermocouples in the reaction chamber. This can improve process reproducibility by providing an accurate picture of the thermal conditions within the entire chamber. The pressure vessel cover may optionally have a noble metal-lined instrument orifice extending therethrough.

Preferred pressure vessels of the invention include those wherein the flange consists essentially of a noble metal alloy, the cover plate consists essentially of a noble metal alloy, and the surface of the self-energizing ring consists essentially of a material selected from the group consisting of noble metals, noble metal alloys and polytetrafluoroethylene, and the inner wall of the cavity liner consists essentially of a noble metal. For example, the flange may consist essentially of a 75% by weight platinum and 25% by weight iridium alloy, the cover plate may consist essentially of a 75% by weight platinum and 25% by weight iridium alloy, and the surface of the self-energizing ring may consist essentially of gold, and the inner wall of the cavity liner may consist essentially of gold. Typically, the self-energizing ring is made from a material selected from the group consisting of: noble metals, noble metal alloys, and base metals coated with noble metals. The self-energizing ring may, for example, be a C-ring, a V-ring, or an O-ring.

The pressure vessel may further comprise an annular support plate having an inner perimeter and outer perimeter, said inner perimeter positioned adjacent to the outer perimeter of the self-energizing ring when the cover plate is sealed to the flange; at least a portion of said annular support plate being positioned between the cover plate and flange when the cover plate is sealed to the flange, said portion having a thickness essentially equal to the selected distance such that the compression of self-energizing ring is limited to the selected distance by said annular support plate when the cover plate is sealed to the flange. The pressure vessel may further comprise an polytetrafluoroethylene O-ring positioned in the inner perimeter of the self-energizing ring when the cover plate is sealed to the flange. The cavity and cavity liner may be essentially cylindrical in shape. Of note are cavity diameters greater than about 1.25 inches.

The components of the pressure vessel of this invention may be configured as shown in FIGS. 1 through 4, discussed more fully below, such that when the removable vessel cover is mounted on the vessel body, the C-ring and its support plate are sandwiched between the chamber seal surface of the flange and the cover seal surface of the cover plate on the removable vessel cover. When the head bolts are tightened to the loading specified by the C-ring manufacturer, the C-ring is compressed slightly to a selected distance, such that it still maintains spring back. One of the functions of the external support ring, discussed below, is to maintain the optimum compression of the C-ring, under proper bolting conditions.

When the vessel is heated, some thermal expansion occurs and the internal fluid pressure increases, the C-ring may be forced open to a small degree. In doing so, the outer surface of the C-ring, typically made of a noble metal, maintains a firm seal with the sufficiently hard surfaces of the flange and cover plate on the vessel cover. Because of this C-ring action, it is critical that the mechanical behavior of the flange and cover plate at operating temperature and pressure not permit any distortion of the smooth sealing surfaces (i.e., the chamber seal surface and the cover seal surface). Significant surface distortion could result in leaks and would require replacement or resurfacing of these flanges. Because of this material performance requirement, the proper selection of the flange and cover plate material is critical to satisfactory operation of the vessel.

Figure 2:
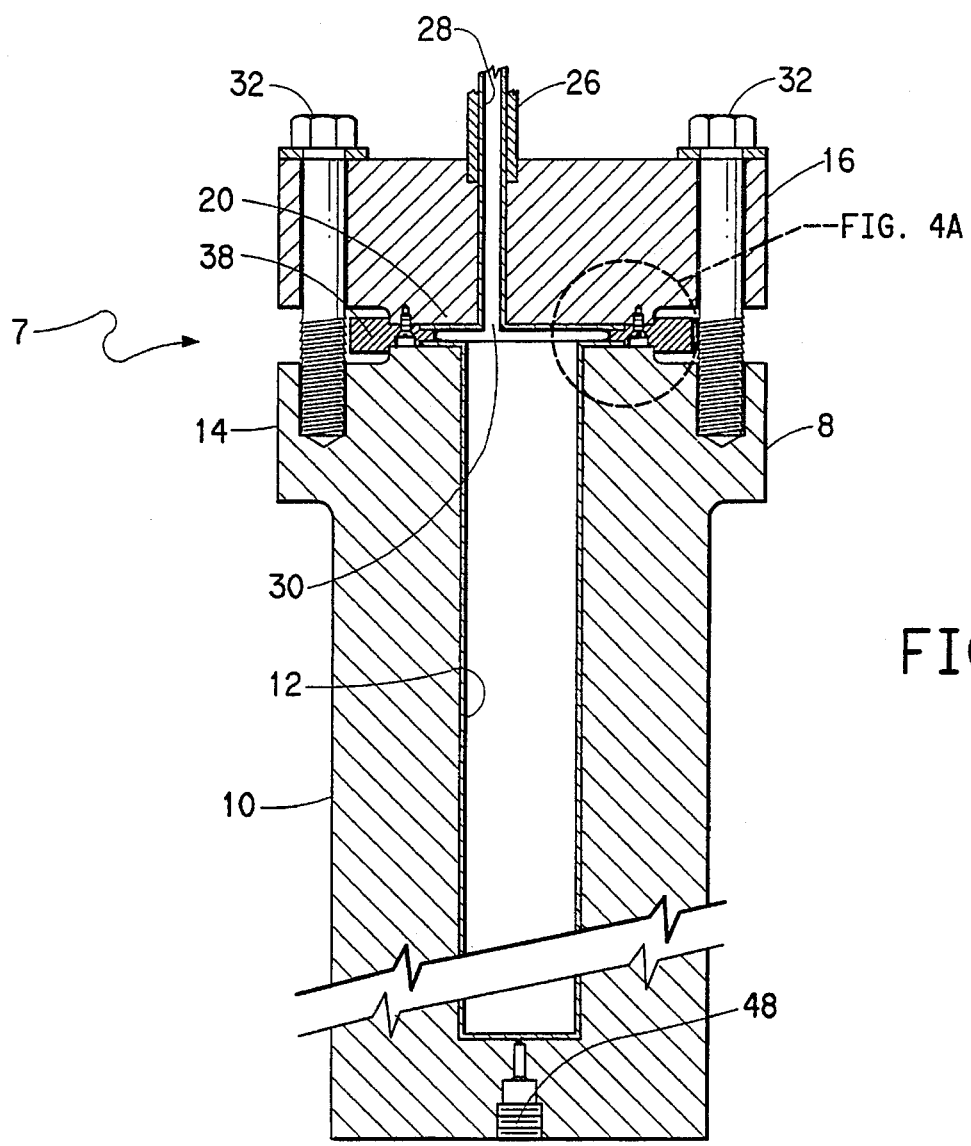
FIG. 2 shows a cross-sectional view through 2—2 of the vessel for hydrothermal crystal growth of FIG. 1.

FIGS. 1 and 2 illustrate a vessel for hydrothermal crystal growth 7 in accordance with this invention. The vessel 7 has a vessel base 8 and a removable vessel cover 16. The base 8 has a vessel body 10 with an internal vessel cavity comprising a cavity wall in contact with cavity liner 12 and a cavity outlet toward cover 16. (It is contemplated that in some embodiments the vessel may be open at both ends, with each end sealed by a seal configuration of this invention.) The vessel body 10 and the corresponding vessel cavity are shown substantially cylindrical in shape. The outer diameter of the vessel body 10 is increased at the cavity outlet (e.g., the wider outer diameter for the cylindrical shaped vessel illustrated in FIG. 2) to facilitate attachment of the vessel base 8 to the vessel cover 16, to enclose the interior vessel cavity. Both the thicker portion 14 of the vessel base and the removable vessel cover 16 contain matching concentric orifices on the perimeter to allow attachment with screws 32. A typical bolting configuration is shown in FIG. 1. Other configurations as well as other means of sealing the vessel which do not require a wider outer diameter (e.g., a hydraulic press) can also be used.

The vessel base 8 has a cavity liner 12 to protect the vessel body 10 from corrosive crystal growth media. The cavity liner 12 is preferably structurally rigid and, for KTP production, is preferably made of a precious metal such as gold, platinum or palladium. The cavity liner 12 has a slightly smaller diameter and length than the cavity in the vessel body such that the outer wall of the liner will contact and fit snugly within the vessel cavity and is supported by the vessel cavity wall. The inner wall of the cavity liner defines a crystal growth chamber having a chamber outlet generally corresponding to the cavity outlet. Using the vessel sealing configuration of this invention, the cavity liner 12 is reusable, and accordingly is a significant improvement over conventional sealed can systems in which a new sealed can must be used for every run.

As discussed above, the vessel body 10 and the vessel cover 16, should be protected from corrosive fluids used in the crystal growth process. Accordingly, as illustrated in FIG. 4A and FIG. 4B, a flange is provided on the cavity liner 12 (e.g., by brazing) at the perimeter of the chamber outlet and extends radially therefrom, thereby protecting the underlying surface of the vessel body. (By radially is meant in a direction perpendicular to, and outward from, the central axis of the vessel cavity.) The flange 18 may also be connected to the vessel body 10 by brazing. The flange 18 may be formed of a noble metal alloy so as to provide an oulet structure with a sealed surface of noble metal alloy. A chamber seal surface is defined on the surface of the flange 18 facing the cover 16.

A cover plate 20 is provided to protect the vessel cover 16 from the crystal growth media. The cover plate 20 is typically made of the same material as the flange 18 and has a cover area 22 facing the base 8 with a cover seal surface defined thereon. The cover area 22 is the outward surface of the cover plate which opposes the internal vessel cavity and outward seal surface of the flange such that the cover seal surface opposes the chamber seal surface when the cover plate 20 is sealed to the flange 18 as described below. The cover seal surface is the section of the cover area 22 which directly opposes the chamber seal surface when the vessel is sealed. The cover plate 20 may be held in place by the annular support plate 38, discussed below, or attached (e.g., brazed) to the vessel cover 16.

The material for the flange 18 and the cover plate 20, should be selected to resist corrosion and to have a hardness value compatible with that of the C-ring By compatible is meant having a sufficient hardness such that little to no indentations are left on the surface of the flange and cover plate after sealing the vessel, which causes the flange and cover plate to directly contact the C-ring. To be compatible, the surface of the C-ring must have a hardness that is lower than the hardness of each of the chamber seal surface and cover seal surface. For production of KTP crystals, a Pt/Ir alloy composition has been found to be suitable, preferably having about 25% Ir by weight. Additionally, when the flange 18 is attached to the walls of the cavity liner 12, brazing, preferably of the same material as the cavity liner 12 (e.g., gold) may be deposited at the circumferential juncture of the cavity liner walls and the flange 18.

The cavity liner 12 is preferably rigid such that thermocouples can be placed directly inside of the reaction chamber during the entire run. A cavity liner 12 which does not deform allows reproducible fluid circulation patterns. This is generally important for routinely obtaining quality crystals.

The vessel cover 16 (including cover plate 20) may include a lined orifice for instruments, reaction stirrers or fluid introduction. A pipe 26 is shown attached to the orifice on the exterior side of the vessel cover 16, and a hollow, cylindrical liner 28, of slightly smaller diameter than the pipe 26, is shown extending through the interior length of the pipe 26 to protect the pipe from the corrosive fluids of the process. The pipe 26 is typically constructed of the same material as the vessel cover 16 and the vessel body 10. The instrument liner 28 is preferably a noble metal like that used for the cavity liner 12. Additionally, brazing or welding, preferably of the same material as the liner 28 (e.g., gold) may be deposited at the juncture of the liner 28 and the cover plate 20.

The pipe 26 and liner 28 may also be attached to a T-block 42, as shown in FIG. 5, using a connector 44. This box can serve as in inlet for gases, thermocouples, reaction stirrers, and/or instruments such as a pressure transducer, through connectors 46. This arrangement provides advantages not generally available in the conventional sealed can method of crystal growth. For example, pressures and temperatures can be measured directly in the interior of the vessel, and gases can be introduced while the reaction is in progress.

The vessel seal, shown in FIGS. 4A and 4B, is formed by the self-energizing C-ring 36, positioned between the cover seal surface of the cover plate 20 and the chamber seal surface of flange 18, such that the inner perimeter of the C-ring (i.e., the open portion of the C-shape) is exposed to the pressure of the vessel when the vessel cover is reversibly connected to the vessel body, and the flange 18 is sealed to the cover plate 20. An annular ring-shaped support plate 38 is shown positioned on the outer perimeter of the C-ring to support and position the C-ring and may be fastened to the vessel cover 16 by bolts 40. This arrangement may also serve to hold the cover plate 20 flush against the vessel cover 16. The height, $h_1$, of the support plate 38, as shown in FIG. 4A, can equal the selected distance to which the C-ring should be compressed, thus serving as a physical barrier to overcompression of the C-ring. The height, $h_2$, as shown in FIG. 3B is the uncompressed ring height of the C-ring prior to sealing. An uncompressed ring is shown in FIG. 4B. The compressed ring height is equal to $h_1$ after sealing, as illustrated in FIG. 4A. Typically, $h_2$ need not be much greater than $h_1$ in order to achieve an effective seal.

The C-ring height 36 is self-energizing in that as the vessel pressure increases the C-ring expands and the seal is secured. A C-ring is generally used because of its self-energizing capability. Any similarly shaped ring can be used, however, or even a ring of other shape, e.g., a V-ring, or a self-energizing O-ring, e.g., an O-ring having an inner spring or tiny holes bored in the ring, provided that the ring is self-energizing. These self-energizing rings are commercially available. By self-energizing is meant that with increasing pressure the ring will approximately conform to the configuration of the junction between the cover seal surface, chamber seal surface and the support plate 38, thereby sealing pressure tight. Any similarly-functioning, self-energizing ring is therefore contemplated and does not contravene the spirit of the invention.

The support plate 38 can be made of any material of suitable strength, typically metals. The C-ring can be made of a base metal which is coated or plated with the same metal as that used for the cavity liner 12 (e.g., gold) to resist corrosion. The surface of the C-ring may be a noble metal, a noble metal alloy or polytetrafluoroethylene. For KTP production, the C-ring is preferably made from a platinum/iridium alloy and is coated with gold plating. To ensure the vessel is pressure tight, the chamber seal surface of the flange 18 and cover seal surface of the cover plate 20 should each have a hardness that is compatible with that of the C-ring. As described above, by compatible is meant that the surface of the self-energizing ring has a hardness that is lower than the hardness of each of the chamber seal surface and cover seal surface. This is considered a key specification in ensuring the integrity of the seal for high temperature, high pressure, hydrothermal crystal growth applications.

The vessel seal may optionally include an O-ring (not shown), preferably made of polytetrafluoroethylene (Teflon®, DuPont, Wilmington, Del.), placed at the inner perimeter of the C-ring 36. Teflon® is preferable because of its corrosion resistance and flow properties. Increases in the vessel pressure will cause the Teflon® O-ring to flow and flatten out, providing additional integrity to the seal formed by the C-ring 36. Operating temperatures, however, may limit when or where a Teflon® seal may be used.

As shown in FIG. 2, a vent hole 48 may be provided to allow venting of gas otherwise trapped between the liner 12 and the vessel body.

For hydrothermal crystal growth external heat is required. A heat source (not shown) is provided to the exterior of the vessel, preferably in a way that a temperature gradient exists over the length of the autoclave.

One specific embodiment of this invention, which may be used in production of KTP crystals, employs a nickel alloy vessel with a rigid gold cavity liner to which is attached a 75% by weight platinum/25% by weight iridium flange. A matching 75% by weight Pt/25% by weight Ir alloy cover plate is used in combination with a gold-plated base metal self-energizing C-ring and a Teflon® O-ring. The Pt/Ir alloy composition is selected to resist corrosion and to have a hardness value compatible with that of the C-ring. The material selection ensures the C-ring sealing configuration would be pressure tight.

The sealing arrangement of this invention eliminates the need for welded cans and the problem of diffusion welding at the seal contact surfaces. This seal is suitable for temperatures up to about 500° C., even in high pH corrosive fluids. The suitable operable pressure range is only limited by the size of the vessel. For example, a 1.5 inch (3.8 cm) inner diameter vessel of this invention may withstand pressures up to about 10,000 psi (68.9 kPa).

Another embodiment of this invention is related to advantageous materials of construction for the vessel body for use in KTP production. Using conventional sealed can systems, or the vessel of this invention, small leaks can develop in the noble metal can or liner used to contain the corrosive phosphate solution used for crystal growth. This is especially likely at high temperatures (e.g., 400–500° C.) and high pressures (e.g., 10,000–30,000 psi). Conventional materials of construction will typically develop cracks and subsequent loss of pressure. This occurs because the phosphate solution contacts the vessel body causing stress corrosion and subsequent cracking. Pure nickel, and nickel alloys containing Ti (a common additive to pressure vessel alloys) will significantly corrode in contact with high temperature phosphate, but the titanium-free nickel alloys will be substantially more resistive to stress corrosion or cracking. This ability to avoid stress cracks makes titanium-free nickel alloys a preferred vessel material for KTP production.

This invention may be further understood by reference to the following non-limiting examples.

EXAMPLES

General Procedure

The crystal growth process used lined vessels and was similar to the growth process used to grow quartz crystals in unlined vessels as described in R. A. Laudise and J. W. Nielsen, *J. Solid State Physics*, 12 (1961) 149–222, incorporated by reference herein.

The basic process consisted of arranging the $KTiOPO_4$ nutrient material in the lower section of a lined vessel. A ladder-like support with $KTiOPO_4$ seed crystals supported thereon was placed in the upper end of the vessel. The lower end (the nutrient zone) and the upper section (the growth zone) were separated by a baffle system that by its open design partly restricted the flow of a solvent liquid between the nutrient and growth zone. The baffle system in conjunction with the external vessel heaters aids in the development of the required temperature gradients between the nutrient and growth zones. In order to transport the KTP nutrient from the nutrient zone to the KTP seed crystals in the growth zone, a selected solvent, such as an aqueous solution of $K_2HPO_4$ as described in U.S. Pat. No. 5,066,356 (hereby incorporated by reference herein) was added to the vessel in an amount that will, at operating temperature and pressure, completely fill the primary cavity of the pressure vessel.

The novel design of the vessel permitted the direct temperature measurement within each zone (see Example 3). The design also permitted direct pressure measurement during the growth of the KTP. The vessel used was a vertical, cylindrical, nickel alloy autoclave, approximately 1.5 inches inside diameter. The vessel has a rigid gold liner, to which was attached a platinum/25% iridium flange. A matching Pt/Ir top flange was used in combination with a gold-plated base metal self-energizing C-ring. The Pt/Ir alloy composition was selected to resist corrosion and to have a hardness value compatible with that of the C-ring.

Example 1

The nutrient zone of the lined vessel was charged with 80.03 g of $KTiOPO_4$ crystalline powder that had been prepared using a flux process (see U.S. Pat. No. 4,231,838). The particle size of the feedstock ranged from under 1 mm to 2–3 mm in the largest dimension. After the KTP powder was placed in the lined vessel, the seed crystal support frame was inserted such that the ends of the frame made contact with the bottom of the liner.

The ladder-like seed crystal support frame held three KTP seed crystals suspended by means of 0.010 inch (0.0254 cm) gold wire. The seeds ranged in thickness from 1.64 mm to 2.57 mm between the parallel {011} faces. Attached to the lower section of the support frame was the gold baffle plate used to separate the growth and nutrient zones.

After the seed crystal support frame was in position, 20.0 g of $KTiOPO_4$ glass was placed above the baffle plate. The $KTiOPO_4$ glass used was prepared in accordance with the procedure described in Example 4 of U.S. Pat. No. 4,305,778, hereby incorporated by reference herein. Specifically, 40.35 g of $TiO_2$, 116.74 g of $KH_2PO_4$ and 61.48 g of $K_2HPO_4$ were mechanically combined and rapidly melted in a platinum crucible placed in a muffle furnace at a temperature of 1000° C. After insuring that all the components had dissolved, the melt was cast onto a thick aluminum plate to quench the resulting glass. After cooling, the cracked glass sections were stored without any further size reduction. For use, the sections were broken up, weighed and calculated quantities of the glass were added directly on the baffle before sealing the vessel.

After loading the solids, the remaining entire free volume was calculated based on the densities of the solid components. For this experiment, an amount of 6M $K_2HPO_4$ solution equal to 90% of the remaining free volume was added to the lined vessel.

The C-ring assembly, along with an optional Teflon® O-ring placed in the inner perimeter of the C-ring, was positioned on the bottom head flange. The multipoint thermocouple was threaded through the baffle plate in the vessel, while the vessel cover was placed on the vessel. The vessel cover was then bolted down and the vessel pressurized with $O_2$ at 2000 psi (13.8 kPa) at room temperature. To check for leaks, the vessel was allowed to stand until a constant value for pressure was obtained. To insure an oxidizing condition during crystal growth, some oxygen was allowed to remain in the vessel, and therefore the $O_2$ pressure was reduced to 155 psi (1 kPa).

The vessel was transferred to a safety barricade and additional thermal insulation was applied to the outer surface of the vessel. Power was supplied to external band heaters on the vessel. By the use of individual controllers for the band heaters, the internal temperatures were brought up to the desired operating conditions, as shown below:

| | |
|---|---|
| Inside temperature top of growth zone: | 398° C. |
| Inside temperature bottom of growth zone: (above baffle plate) | 405° C. |
| Inside temperature nutrient zone: | 420° C. |
| Pressure: | 8298 psi (57.2 kPa) |
| Run Time: | 18 days |

On cooling, the resulting crystals obtained were clear and were found to have grown at a rate of 0.7 mm/side/week, bottom crystal to approximately mm/side/week, top crystal. Inductively Couple Plasma (I.C.P.) spectroscopic elemental analysis on the resulting fluid indicated no base metal contamination.

Example 2

This example was conducted similar to that described in Example 1, except for the following differences. A Teflon® O-ring was not used in the seal surface. The components charged to the vessel were: 60.2 g KTP nutrient, 21.06 g KTP glass, 0.27 g of $KNO_3$, 5M solution of $K_2HPO_4$ to 88% fill, and 100 psi of $O_2$. The vessel was run for 22 days with the following operating temperatures:

| | |
|---|---|
| Inside temperature top of growth zone: | 332° C. |
| Inside temperature bottom of growth zone: | 342° C. |
| Inside temperature nutrient zone: | 375° C. |
| Pressure: | 9304 psi (64.1 kPa) |
| Run Time: | 22 days |

The result was clear growth on the {011}seeds, at a rate of about 0.50 mm/side/week. I.C.P. elemental analysis of the resulting fluid indicated no base metal contamination.

Example 3

In the example a Telfon® O-ring was used inside the C-ring similar to Example 1. This example was conducted similar to that described in Example 1, except for the following differences. The components charged were: 89.07 g KTP nutrient, 18.56 g KTP glass, 6M $K_2HPO_4$ solution to 90% fill and 247 psi $O_2$ pressure. The vessel was run for 18 days with the following operating temperatures:

| | |
|---|---|
| Inside temperature top of growth zone: | 382° C. |
| Inside temperature bottom of growth zone: | 392° C. |
| Inside temperature nutrient zone: | 405° C. |
| Pressure: | 8800 psi (60.7 kPa) |
| Run Time: | 18 days |

The result was clear growth on the {011}seeds at a rate of about 1.2 to 1.4 mm/side/week.

Example 4

The novel design of the vessel permitted the direct temperature measurement within each zone. The temperature data shown in Table I illustrates wide the temperature errors that can exist between reaction chamber readings and outside wall readings. The runs listed below were run at different heater operating temperatures. Temperature readings were taken using thermocouples positioned on the exterior of the vessel adjacent to the band heaters. Heaters #2 and #3 were positioned in the middle of the vessel, middle-bottom and middle-top, respectively. Interior temperatures were measured by a multi-point thermocouple in the interior of the vessel, at three points, the nutrient zone being at the very bottom of the vessel. Results were as follows:

TABLE 1

EXTERIOR V. INTERIOR TEMPERATURE READINGS

| | EXTERIOR TEMPERATURES °C. | | INTERIOR TEMPERATURES °C. |
|---|---|---|---|
| RUN 1 | | RUN 1 | |
| Heater #4 - Top | 351 | Top - growth zone | 398 |
| Heater #3 | 319 | Bottom - growth zone | 405 |
| Heater #2 | 328 | Nutrient zone | 420 |

TABLE 1-continued

EXTERIOR V. INTERIOR TEMPERATURE READINGS

| | EXTERIOR TEMPERATURES °C. | | INTERIOR TEMPERATURES °C. |
|---|---|---|---|
| Heater #1 - Bottom | 449 | | |
| RUN 2 | | RUN 2 | |
| Heater #4 - Top | 466 | Top - growth zone | 332 |
| Heater #3 | 436 | Bottom - growth zone | 342 |
| Heater #2 | 414 | Nutrient zone | 375 |
| Heater #1 - Bottom | 445 | | |
| RUN 3 | | RUN 3 | |
| Heater #4 - Top | 423 | Top - growth zone | 382 |
| Heater #3 | 401 | Bottom - growth zone | 392 |
| Heater #2 | 402 | Nutrient zone | 405 |
| Heater #1 - Bottom | 431 | | |

Example 5

Vessel Constructed of Titanium-free Alloy

A conventional test vessel using Hastalloy was constructed having a 2 inch×1.5 inch cavity. A sealed gold can was placed in the interior and contained the crystal growth apparatus and media. Using a procedure similar to that described in Example 1, differing only in the vessel and seal used, small leaks occurred from the gold can used to contain the KTP and phosphate solution while operating at 400° C. to 500° C. and 10000 to 30000 psi. After the run was completed, inspection of the vessel revealed some surface corrosion, however, there was no stress corrosion or cracking. Therefore, the vessel could be cleaned and reliably used again.

The Hastalloy was further tested for corrosion and soluble components by the following method. A small nut and bolt configuration was constructed using Hastalloy. The configuration was put under tension and was then loaded into a gold can containing a phosphate solution. After welding the gold can shut, the can was placed in an autoclave and heated for approximately one week at 400° C. to 450° C. The configuration was then examined for corrosion and the liquid was tested to determine the soluble components. The configuration did show some corrosion, and some components of the Hastalloy were detected in the liquid, but no stress cracks were observed.

What is claimed is:

1. A seal apparatus for sealing an outlet of a pressurized chamber, comprising:
   (a) a chamber outlet structure having a chamber seal surface consisting essentially of a noble metal in a cold-wall system alloy around the periphery of the chamber outlet and extending radially therefrom;
   (b) a removable cover for sealing the chamber outlet structure, having a cover area for covering the chamber outlet, said cover area having a cover seal surface consisting essentially of a noble metal alloy, which opposes the chamber seal surface when the cover is sealed to the chamber outlet structure;
   (c) means for reversibly connecting the cover to the chamber outlet structure with the cover seal surface positioned a selected distance from the chamber seal surface when the cover is sealed to the chamber outlet structure; and (d) a compressible self-energizing ring having a ring height greater than said selected distance prior to sealing the cover to the chamber outlet structure, and a perimeter shaped for positioning around the chamber outlet and between the chamber seal surface and the cover seal surface such that when the cover is sealed to the chamber outlet structure, the ring is compressed between the cover seal surface and the chamber seal surface to a height equal to the selected distance, thereby providing a seal against fluid loss from the chamber and contamination to the chamber; the surface of the ring consisting essentially of a material selected from the group consisting of noble metals, noble metal alloys and polytetrafluoroethylene, which has a hardness lower than the hardness of the chamber seal surface and lower than the hardness of the cover seal surface, such that neither the chamber seal surface nor the cover seal surface is substantially deformed when the cover is sealed to the chamber outlet structure.

2. A pressure vessel for hydrothermal crystal growth using a crystal growth media, comprising:

(a) a vessel base, including (i) a vessel body having a cavity with a cavity wall and a cavity outlet, and (ii) a cavity liner which is resistant to corrosion by the crystal growth media, having an outer wall in contact with and supported by the cavity wall, an inner wall defining a crystal growth chamber having a chamber outlet, and a flange positioned at the perimeter of the chamber outlet, said flange having a chamber seal surface around the perimeter of the chamber outlet and extending radially therefrom;

(b) a removable vessel cover including a cover plate for sealing to the flange, said cover plate being resistant to corrosion by the crystal growth media and having a cover area for covering the chamber outlet, the cover area having a cover seal surface which opposes the chamber seal surface when the cover plate is sealed to the flange;

(c) means for reversibly connecting the vessel cover to the vessel body such that the cover seal surface is positioned a selected distance from the chamber seal surface when the cover plate is sealed to the flange; and (d) a compressible self-energizing ring having an uncompressed height greater than the selected distance prior to sealing the cover plate to the flange, said ring being shaped for positioning around the chamber outlet and between the chamber seal surface and the cover seal surface, such that when the cover plate is sealed to the flange, the ring is compressed between the cover seal surface and the chamber seal surface to a height equal to the selected distance, thereby providing a seal against fluid loss from the chamber and contamination to the chamber;

the surface of the ring being resistant to corrosion by the crystal growth media, and having a hardness lower than the hardness of the chamber seal surface and lower than the hardness of the cover seal surface, such that neither the chamber seal surface nor the cover seal surface is substantially deformed when the cover is sealed to the chamber outlet structure.

3. The pressure vessel of claim 2 wherein the flange consists essentially of a noble metal alloy, the cover plate consists essentially of a noble metal alloy, and the surface of the self-energizing ring consists essentially of a material selected from the group consisting of noble metals, noble metal alloys and polytetrafluoroethylene, and the inner wall of the cavity liner consists essentially of a noble metal.

4. The pressure vessel of claim 3 wherein the flange consists essentially of a 75% by weight platinum and 25% by weight iridium alloy, the cover plate consists essentially of a 75% by weight platinum and 25% by weight iridium alloy, the surface of the self-energizing ring consists essentially of gold, and the inner wall of the cavity liner consists essentially of gold.

5. The pressure vessel of claim 4 wherein the self-energizing ring is a C-ring.

6. The pressure vessel of claim 2 wherein the vessel cover has a noble metal-lined instrument orifice extending therethrough.

7. The pressure vessel of claim 2 further comprising an annular support plate having an inner perimeter and outer perimeter, said inner perimeter positioned adjacent to the outer perimeter of the self-energizing ring when the cover plate is sealed to the flange, at least a portion of said annular support plate being positioned between the cover plate and flange when the cover plate is sealed to the flange, said portion having a thickness essentially equal to the selected distance such that the compression of self-energizing ring is limited to the selected distance by said annular support plate when the cover plate is sealed to the flange.

8. The pressure vessel of claim 2 further comprising a polytetrafluoroethylene O-ring positioned in the inner perimeter of the self-energizing ring when the cover plate is sealed to the flange.

9. The pressure vessel of claim 8 wherein the cavity and cavity liner are essentially cylindrical in shape, the cavity diameter being greater than about 1.25 inches.

10. A pressure vessel for hydrothermal crystal growth of crystals of the formula $MTiOXO_4$ wherein M is selected from the group consisting of K, Rb, Tl, $NH_4$ and mixtures thereof and X is selected from the group consisting of P, As and mixtures thereof, using a crystal growth media, comprising:

(a) a vessel base including (i) a vessel body of a nickel alloy essentially free of titanium having a cavity with a cavity wall and a cavity outlet, and (ii) a cavity liner which is resistant to corrosion by the crystal growth media having an outer wall in contact with and supported by the cavity wall, an inner wall defining a crystal growth chamber having a chamber outlet, and a flange positioned at the perimeter of the chamber outlet, said flange having a chamber seal surface around the perimeter of the chamber outlet and extending radially therefrom;

(b) a removable vessel cover having a cover seal surface which opposes the chamber seal surface when the vessel cover is sealed to the vessel base;

(c) means for reversibly connecting the vessel cover to the vessel body; and (d) means for sealing the crystal growth chamber between the cover seal surface and the chamber seal surface against fluid loss from the chamber and contamination to the chamber.

* * * * *